United States Patent
Yeh et al.

[19]

[11] Patent Number: 5,803,340
[45] Date of Patent: Sep. 8, 1998

[54] COMPOSITE SOLDER PASTE FOR FLIP CHIP BUMPING

[75] Inventors: Shing Yeh, Buffalo Grove, Ill.; Bradley Howard Carter, Kokomo, Ind.

[73] Assignee: Delco Electronics Corporation, Kokomo, Ind.

[21] Appl. No.: 536,592

[22] Filed: Sep. 29, 1995

[51] Int. Cl.⁶ .................................................. H01L 21/441
[52] U.S. Cl. ................. 228/56.3; 228/248.5; 228/180.22
[58] Field of Search ............................ 228/248.1, 248.5, 228/180.22, 56.3; 148/24

[56] References Cited

U.S. PATENT DOCUMENTS

| | | | |
|---|---|---|---|
| 2,623,273 | 12/1952 | Murray et al. | 29/180 |
| 4,705,205 | 11/1987 | Allen et al. | 228/180.22 |
| 5,024,372 | 6/1991 | Altman et al. | 228/254 |
| 5,154,341 | 10/1992 | Melton et al. | 228/180.22 |
| 5,229,070 | 7/1993 | Melton et al. | 228/207 |
| 5,317,191 | 5/1994 | Abe | 257/772 |
| 5,328,521 | 7/1994 | Keusseyan | 148/22 |
| 5,382,300 | 1/1995 | Blonder et al. | 148/24 |
| 5,415,944 | 5/1995 | Kazem-Goudarzi et al. | 428/567 |
| 5,429,293 | 7/1995 | Bradley, III et al. | 228/248.1 |
| 5,540,379 | 7/1996 | Kazem-Goudarzi et al. | 228/248.5 |
| 5,558,271 | 9/1996 | Rostoker et al. | 228/180.22 |

FOREIGN PATENT DOCUMENTS 164906 12/1885 European Pat. Off. .

OTHER PUBLICATIONS

Pavio, "Successful Alloy Attachment of GaAs MMIC's" IEEE Transactions of Electron Devices, No. 12, Dec. 1987.

*Primary Examiner*—Kenneth J. Ramsey
*Attorney, Agent, or Firm*—Jimmy L. Funke

[57] ABSTRACT

Composite solder paste compositions adapted to be deposited using a dry film photoresist mask to form solder joints for flip chip integrated circuit devices. The composite solder paste compositions are characterized by the ability to flow at a first temperature during bumping reflow while the photoresist mask is present, yet upon subsequently reheating to a higher temperature yield solder joints capable of withstanding temperatures of 200° C. and higher. As such, the present invention retains the advantages associated with using a dry film photoresist as a mask during deposition of the solder, yet results in the formation of solder joints that exhibit enhanced reliability in severe thermal environments.

17 Claims, 1 Drawing Sheet

COMPOSITE SOLDER PASTE FOR FLIP CHIP BUMPING

The present invention generally relates to solder compositions of the type used to solder flip chips to circuits. More particularly, this invention relates to solder paste compositions that yield such solder compositions, wherein the paste compositions are formulated to have a chip mount reflow temperature that is higher than the corresponding bumping reflow temperature, such that the resulting solder compositions are suitable for high temperature applications yet can be deposited using dry film photoresist masking methods.

BACKGROUND OF THE INVENTION

Flip chips are monolithic semiconductor devices, such as integrated circuits, having bead-like terminals formed on one surface of the chip. The terminals, commonly referred to as solder bumps, serve to both secure the chip to a circuit board and electrically interconnect the flip chip's circuitry to a conductor pattern formed on the circuit board, which may be a ceramic substrate, printed wiring board, flexible circuit, or a silicon substrate. The solder bumps are generally formed by selectively depositing a solder composition, such as a solder paste, on the flip chip, and then reflowing the solder material by heating the material above its liquidus temperature so that the molten material coalesces to form the solder bumps on the surface of the chip. After solidifying, the solder bumps can be precisely registered with their corresponding conductors, and then reheated above the solder material's liquidus temperature in order to bond the chip to the conductors. The temperature at which the solder is reflowed to form the solder bump and later reflowed to mount the flip chip is generally referred to as the bumping reflow temperature, though the latter may be more accurately termed the chip mount reflow temperature.

Current trends in the electronic industry include the imposition of significant size constraints to achieve smaller electronic packages. Such constraints often necessitate finer pitch conductors and solder bumps, which in turn place demands on the techniques employed to deposit and form the solder bumps. A particularly suitable process employed in the industry for achieving fine pitch solder bumps involves the use of a dry film photoresist film as a mask through which a solder paste is printed onto a flip chip. Such methods are particularly capable of mass producing precisely-formed solder bumps of a desirable size, generally on the order of about 140 micrometers (about 5.5 mils) in height. As a result, dry film masking techniques are widely used in mass production processes in the automotive electronics industry.

However, typical dry film photoresists limit the reflow temperature of the solder to not more than about 290° C., necessitating the use of solder compositions that are unacceptable for higher temperature applications where junction temperatures in excess of about 200° C. are possible. For example, solder alloys compatible with the maximum 290° C. limitation for reflow include 50 In/50 Pb and 60 Sn/40 Pb alloys that are limited to junction temperatures of about 140° C. (generally corresponding to an ambient temperature of about 125° C. for low power devices), while 0.4 Ag/37 In/62.6 Pb solder alloys are limited to junction temperatures of about 165° C. (generally corresponding to an ambient temperature of about 140° C.). In comparison, solder alloys incompatible with the 290° C. reflow limitation include Sn/Pb alloys having a lead content of at least about 85 weight percent and In/Pb alloys having a lead content of at least about 75 weight percent, all of which are generally capable of maintaining adequate mechanical and fatigue properties at temperatures above 200° C.

Though dry film photoresists having a higher temperature capability are available, such films are generally difficult to strip from the flip chip after reflow, and therefore are poorly suited for use in mass production. An alternative to the use of dry film photoresists is stencil printing techniques. However, stencils produce solder bumps of limited height, generally on the order of about 110 micrometers (about 4.5 mils) or less, which may be inadequate for some applications. Specifically, adequate solder bump height after reflow is necessary in order to prevent the surface tension of the molten solder bumps from drawing the flip chip excessively close to the substrate during the chip mount reflow operation. Sufficient spacing between the chip and its substrate is necessary to enable stress relief during thermal cycles, allow penetration of cleaning solutions for removing undesirable residues, and permit penetration of mechanical bonding and encapsulation materials between the chip and its substrate. Consequently, greater solder bump heights are generally advantageous from the standpoint of solder joint reliability.

From the above, it can be appreciated that the prior art lacks a flip chip solder bumping process suitable for use in mass production and capable of forming solder joints having optimal physical and thermal properties. Accordingly, it would be desirable if a solder composition was available that was capable of forming solder joints that could reliably withstand temperatures in excess of 200° C., yet permitted the use of conventional dry film photoresists as masks for precisely depositing the solder composition in sufficient amounts to produce solder bumps that are suited for more demanding applications.

SUMMARY OF THE INVENTION

It is an object of this invention to provide a solder composition capable of withstanding temperatures in excess of 200° C., yet permits the use of conventional dry film photoresist materials as a mask for precisely depositing the solder composition.

It is another object of this invention that the solder composition be a composite solder paste containing multiple solder paste alloy compositions.

It is a further object of this invention that one of the solder paste alloy compositions has lower liquidus and solidus temperatures than the other solder paste alloy compositions.

It is yet another object of this invention that the solder pastes be combined such that the composite solder paste is characterized by a bumping reflow temperature at which only the one solder paste alloy composition liquefies, enabling the composite solder paste to flow at temperatures of less than about 300° C.

It is still another object of this invention that the solder pastes be combined such that the composite solder paste is characterized by a chip mount reflow temperature at which the solder paste completely liquefies, such that the solder paste yields a solder alloy capable of forming a flip chip solder joint that will reliably withstand temperatures in excess of 200° C.

In accordance with a preferred embodiment of this invention, these and other objects and advantages are accomplished as follows.

According to the present invention, there is provided solder paste compositions adapted to be deposited using a dry film photoresist mask to form solder joints for flip chip integrated circuit devices. In particular, solder paste compositions of this invention are characterized by the ability to flow at a first temperature during bumping reflow while the photoresist mask is present, yet upon subsequently reheating to a higher temperature yields a solder joint capable of withstanding high temperatures. As such, the present invention retains the advantages associated with using a dry film photoresist as a mask during deposition of the solder, yet results in the formation of solder joints that exhibit enhanced reliability in severe thermal environments.

Generally, a solder paste composition of this invention includes multiple solder paste constituents. As an example, the solder paste composition may contain two solder paste constituents, one of which having higher liquidus and solidus temperatures than that of the other solder paste constituent. One method for achieving this aspect is for the solder paste constituents to contain lead-based solder alloy particles, with one constituent having a higher lead content and therefore higher liquidus and solidus temperatures than the other constituent. Accordingly, the lower-lead paste constituent establishes a bumping reflow temperature below the liquidus temperature of the higher-lead paste constituent, such that higher-lead paste constituent is suspended within the solder paste composition during the process by which solder bumps are formed on a flip chip with the use of photoresist mask. Thereafter, the photoresist mask can be stripped and the solder bumps reheated to a chip mount reflow temperature established by the higher-lead paste constituent. The chip mount reflow temperature is higher than the bumping reflow temperature as a result of the higher liquidus temperature of the higher-lead paste composition, and therefore causes both of the solder paste constituents to liquefy and form a solder alloy having a lead content that is between the lead contents of the solder paste constituents. As a result, the solder alloy is characterized by a higher temperature capability than what would be enabled by the lower-lead paste constituent alone.

In a preferred embodiment, the solder paste constituents both contain indium-lead alloy powders, though it is foreseeable that other alloy powders could be used. In accordance with the objects of this invention, a preferred solder paste composition is generally characterized by a bumping reflow temperature of less than the maximum temperature capability of the photoresist material used to form the mask, yet yields a solder joint capable of a maximum junction temperature in excess of 2000° C., corresponding to a chip mount reflow temperature in excess of 3000° C. based on reliability considerations in conjunction with the solidus temperature of the solder alloys of the composition. To achieve the above, the lead content of the lower-lead solder paste constituent is preferably at most about sixty weight percent, while the lead content of the higher-lead solder paste constituent is at least about ninety weight percent. Furthermore, the solder paste constituents are preferably combined at a ratio of at least about 40:60, but preferably not more than about 50:50 in order to attain suitable bumping reflow characteristics, to yield an alloy containing at least about seventy weight percent, and more preferably at least about seventy-five weight percent lead.

Solder paste compositions in accordance with the above enable a novel solder bump process made possible by the differing reflow temperatures established by the different solder paste constituents. After being separately formulated and prepared to contain their respective alloy powders, the solder paste constituents are combined to form the solder paste composition. The solder paste composition is then deposited on a flip chip surface through a dry film photo-resist mask of a type known in the art. The solder paste composition is then heated to a bumping reflow temperature at which only the alloy powder of the lower-lead solder paste constituent liquefies, causing the solder paste composition to flow and form a molten and coalesced solder ball on the flip chip. Upon cooling, the solder ball solidifies to form a solder bump on the surface of the flip chip. Thereafter, the photoresist mask is stripped, and the solder bump is reheated to a chip mount reflow temperature that is higher than the bumping reflow temperature employed to form the solder bump. At the chip mount reflow temperature, the alloy powders of both of the solder paste constituents are liquefied so as to yield an alloy having a lead content that is between the lead contents of the original alloy powders, and therefore is characterized by higher liquidus and solidus temperatures than the lower-lead paste constituent.

In view of the above, it can be seen that a significant advantage of the present invention is that it provides a solution to the inability for flip chip solder joints formed using dry film photoresist masks to reliably withstand high junction temperatures. Specifically, the solder paste composition of this invention is capable of being flowed at a bumping reflow temperature that is compatible with dry film photoresist materials, and then later re-alloyed in situ at the chip mount reflow temperature to yield a solder joint having a higher liquidus temperature. In effect, the higher-lead solder paste constituent remains dormant within the solder paste composition until the composition is sufficiently heated to liquefy its higher-lead alloy powder. The resulting solder joint preferably exhibits desirable shear strength and thermal cycle fatigue resistance at temperatures of 200° C. and higher, thereby enabling its associated flip chip to be reliably mounted on circuit boards subject to severe thermal environments.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
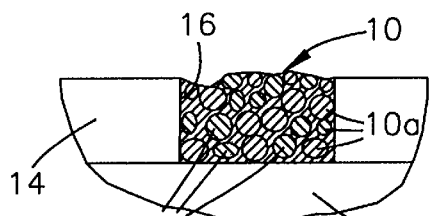
FIG. 1 shows, in cross-section, a solder paste composition deposited through a dry film photoresist mask on the surface of a flip chip, wherein the solder paste composition is formulated in accordance with the present invention.
Figure 2:
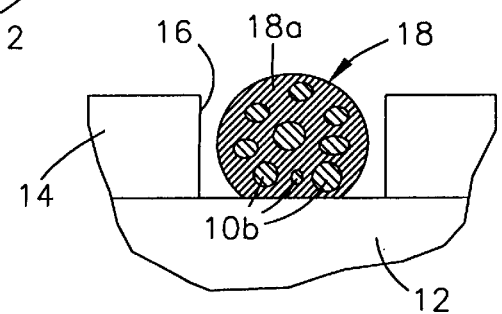
FIG. 2 shows the solder paste composition of FIG. 1 after being reflowed at a bumping reflow temperature to form a solder bump.
Figure 3:
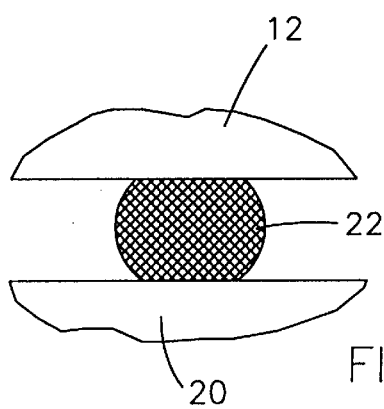
FIG. 3 shows a solder joint between the flip chip and a circuit board substrate following reheating of the solder bump to a chip mount reflow temperature that is higher than the bumping reflow temperature.

FIGS. 1 through 3 generally represent the processing steps for a composite solder paste 10 formulated according to the present invention. As represented in FIG. 1, the composite solder paste 10 is of the type intended to be deposited onto a flip chip 12 using a mask 14 formed by a dry film photoresist material. In accordance with this invention, the composite solder paste 10 is indicated in FIGS. 1 and 2 as being composed of two different solder pastes 10a and 10b, though it is foreseeable that more than two solder paste compositions could be employed to form the composite solder paste 10.

As is conventional, the pastes 10a and 10b are each composed of a powdered metal alloy and a binder, such as a flux compound. Contrary to conventional practice, the solder pastes 10a and 10b employ different metal alloys, with the metal alloy of the first paste 10a being characterized by a lower liquidus temperature than the metal alloy of the second paste 10b. While various metal alloy powders could be employed, in a preferred embodiment the powders each contain lead, with the first paste 10a having a lower lead content than the second paste 10b. Suitable alloy powders are those whose solidus temperature increases with an increased lead content, and include indium-lead alloys. According to this invention, the powdered metal alloy of the first paste 10a has a lead content of about fifty to about sixty weight percent, and an indium content of about forty to about fifty weight percent. In contrast, the metal alloy of the second paste 10b should have a lead content of at least about ninety weight percent, and preferably about 92.5 to about 97.5 weight percent, with an indium content of not more than about 5 weight percent, and preferably about 2.5 to about 5 weight percent. In addition to the above, the metal alloy of the second paste 10b may be a silver-indium-lead alloy having a silver content of up to about 2.5 weight percent. Specific alloy compositions and preferred mixing ratios will be discussed in greater detail below.

Regardless of the specific solder pastes constituents employed to form the composite solder paste 10, a key aspect of this invention is that the solder paste 10 be formulated to be compatible with the use of dry film photoresist masks and to enable a solder bump process characterized by differing bumping and chip mount processing temperatures. In accordance with this invention, a solder bump process enabled by this invention is generally represented in FIGS. 1 through 3. After the solder pastes 10a and 10b are separately formulated, the pastes 10a and 10b are combined to form the composite solder paste 10. The solder paste 10 is then deposited on a surface of the flip chip 12 through the dry film photoresist mask 14, as indicated by FIG. 1. As is known in the art, the photoresist material is generally a photoimagable negative dry film, such as LAMINAR LP or LAMINAR KM available from Dynachem. While such photoresist materials are highly desirable on the basis of their ability to be employed at thicknesses of about 0.1 millimeter or more, and to be precisely imaged to form through-holes 16 capable of receiving a relatively large amount of paste 10, the maximum processing temperature of these materials is generally about 290° C. Consequently, while the mask 14 is in place on the flip chip 12, it is essential that processing temperatures remain below about 290° C. By necessity, the mask 14 must be in place during bump formation, such that a 290° C. limitation is placed on the bumping reflow temperature of the solder paste 10.

According to this invention, the solder paste 10 is characterized by a bumping reflow temperature that will not degrade the photoresist mask 14. An important aspect of this capability is that the bumping reflow temperature is sufficient to liquefy the first solder paste 10a by melting its alloy powder, yet will not liquefy the second solder paste 10b. It follows that the first solder paste 10a must be present within the solder paste 10 in an amount sufficient for the solder paste 10 to flow and coalesce, resulting in the formation of a solder bump 18 depicted in FIG. 2. As indicated, the solder bump 18 is composed of the second solder paste 10b dispersed within a solder 18a resulting from liquefication of the first solder paste 10a and volatilization and displacement of its flux constituent. Once the solder bump 18 is formed, the chip 12 can be cooled and the photoresist mask 14 stripped. Because the mask 14 used was a dry film photoresist, solder bump heights of about 140 micrometers and more are advantageously achieved by the method of this invention.

The next step is to register the flip chip 12 with its intended conductor pattern (not shown), as represented in FIG. 3, such that each solder bump 18 is registered with a corresponding conductor (not shown) on a circuit board 20 or other substrate to which the chip 12 is to be soldered. Thereafter, chip attachment involves reheating the chip 12 and the solder bump 18 to a chip mount reflow temperature that is higher than the bumping reflow temperature used to form the solder bump 18, such that the alloy powders of both the first and second solder pastes 10a and 10b are liquefied to yield a homogenous alloy having a lead content that is between that of the original alloy powders of the solder pastes 10a and 10b. As a result, the alloy formed by the pastes 10a and 10b is characterized by substantially higher liquidus and solidus temperatures than the alloy powder of the first solder paste 10a alone. Upon cooling, the solder bump 18 forms a solder joint 22 that firmly attaches the chip 12 to the board 20. Because of the solder bump height achieved by the use of the photoresist mask 14, the solder joint 22 provides sufficient spacing between the chip 12 and board 20 to enable stress relief in the joint 22 during thermal cycles, allow penetration of cleaning solutions for removing undesirable residues between the chip 12 and board 20, and permit penetration of mechanical bonding and encapsulation materials between the chip 12 and board 20.

The general principles outlined above furnish a method by which a composite solder paste composition is able to have different bumping and chip mount reflow temperatures, enabling the use of conventional dry film photoresist materials while yielding solder joints that can withstand applications having junction temperatures of 2000° C. and more. Particular composite solder compositions that achieve this capability were evaluated for bumping reflow characteristics, chip mount reflow characteristics, shear strength and thermal cycle fatigue resistance.

Compositions for powdered metal alloys tested are summarized in Table I below.

TABLE I

| | SOLDER ALLOY COMBINATION | FINAL ALLOY COMPOSITION | SOL. (C) | LIQ. (C) |
|---|---|---|---|---|
| A: | 50%[50In/50Pb]+ 50%[5In/95Pb] | 27.5In/72.5Pb | 222 | 260 |
| B: | 50%[50In/50Pb]+ 50%[2.5Ag/5In/92.5Pb] | 1.25Ag/27.5In/71.25Pb | 222 | 260 |
| C: | 40%[50In/50Pb]+ 60%[5In/95Pb] | 23In/77Pb | 233 | 269 |
| D: | 40%[50In/50Pb]+ 60%[2.5Ag/5In/92.5Pb] | 1.5Ag/23In/75.5Pb | 233 | 269 |
| E: | 50%[40In/60Pb]+ 50% [5In/95Pb] | 22.5In/77.5Pb | 234 | 270 |
| F: | 50%[40In/60Pb]+ 50%[2.5Ag/5In/92.5Pb] | 1.25Ag/22.5In/76.25Pb | 234 | 270 |
| G: | 40%[40In/60Pb]+ 60%[5In/95Pb] | 19In/81Pb | 244 | 275 |
| H: | 40%[40In/60Pb]+ 60%[2.5Ag/5In/92.5Pb] | 1.5Ag/19In/79.5Pb | 244 | 275 |

The above solidus and liquidus temperatures are for the final alloy compositions indicated for the solder alloy combinations tested, and therefore are relevant to the chip mount reflow temperature of the composite solder composition and the ultimate temperature capability (e.g., junction temperature) of solder joints formed by the final alloy compositions. In contrast, bumping reflow temperatures of the solder alloy compositions indicated above are based on the solidus and liquidus temperatures of their low-lead alloy constituents: 180° C. and 209° C. respectively for those containing 50 In/50 Pb, and 197° C. and 231° C. respectively for those containing 40 In/60 Pb. Consequently, each of the combinations of Table I were theoretically compatible with the use of masks formed from conventional dry film photoresist materials.

A first phase of evaluating the above solder combinations involved determining the bumping reflow characteristics of the combinations at temperatures of 270° C., 280° C. and 290° C., and therefore below the solidus and liquidus temperatures of the high-lead constituents of the tested combinations (300° C. and 313° C. respectively for 5 In/95 Pb, and 300° C. and 310° C. respectively for 2.5 Ag/5 In/92.5 Pb). As a result, the high-lead constituents were suspended in their respective molten lower-lead constituents during this test. Of the combinations identified in Table I, Combinations A and B both performed well at bumping reflow temperatures of 270° C., 280° C. and 290° C., and Combinations A through F performed well at bumping reflow temperatures of 280° C. and 290° C. In contrast, Combinations G and H generally did not exhibit adequate reflow at the temperatures tested. Combinations A through F were identified as being particularly well suited for bumping reflow processes at temperatures below 300° C., and therefore compatible with the use of conventional dry film photoresist masks. The average bump heights for all solder bumps produced during the bumping reflow test were about 140 to about 145 micrometers (about 5.5 to about 5.7 mils), and therefore were an appropriate height for flip chip bonding methods.

Chip mount reflow characteristics were then evaluated by reheating the solder bumps to temperatures of 280° C., 300° C. and 330° C. During this phase of testing, the solder bumps were re-alloyed in situ as a result of both the lower and higher lead constituents being liquefied, yielding solder joints having the solidus and liquidus temperatures indicated in Table I. Combinations A and B both performed well at all three reflow temperatures tested, Combinations C through F performed well at reflow temperatures of 300° C. and 330° C., and Combinations G and H performed well at a reflow temperature of 330° C. only.

Figure 4:
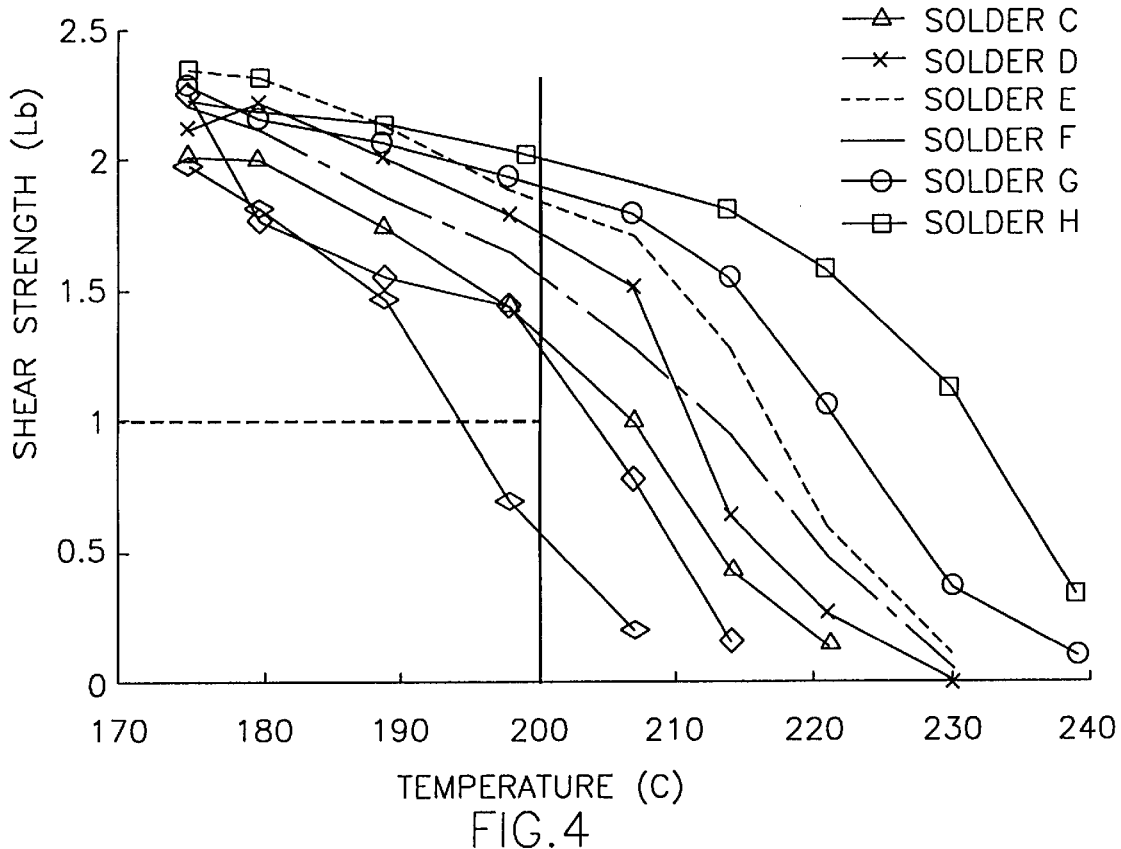
FIG. 4 graphically represents shear strength as a function of ambient temperature for solder joints formed from solder paste compositions formulated in accordance with this invention.

Solder joints formed from each of the combinations identified in Table I were then tested for shear strength using identical flip chip wafers and with processing parameters including a bumping reflow temperature of about 290° C. and a chip mount reflow temperature of about 330° C. The results of this test are represented in FIG. 4, with the 200° C. demarcation being indicated as the target temperature for gaging a minimum shear strength capability. Based on test conditions, a shear strength of about one pound (about 4.5 Newtons) was established as a minimum acceptable level. From FIG. 4, it can be seen that all but Combination A met the minimum levels established for this test.

Finally, a −50°/165° C. thermal cycle fatigue test was performed on solder joints formed from the solder combinations of Table I. Generally, all solder joints performed well, with solder joints formed from Combinations A through G performing particularly well over 1500 cycles. Notably, the solder joints performed equivalently to commercially-available high temperature solder compositions such as 0.4 Ag/37 In/62.6 Pb, a prior art solder composition with the highest lead content that could previously be processed using a dry film photoresist masking process.

From the above tests, it is apparent that each of the above combinations of Table I exhibited suitable reflow, mechanical and fatigue properties for flip chip applications, depending on the particular requirements of a given application. Combinations D and F were considered to be particularly well suited for flip chip applications, based on their ability to readily flow at temperatures below 290° C. and achieve adequate solder bump heights during solder bump formation, their flow characteristics during chip mount reflow, and their ability to produce high-strength, fatigue-resistant solder joints for temperatures above 200° C.

Accordingly, it can be seen that a significant advantage of this invention is that it provides a solution to the inability for flip chip solder joints formed using dry film photoresist masks to reliably withstand temperatures of 200° C. and higher. Specifically, composite solder pastes formulated in accordance with this invention are capable of being flowed at bumping reflow temperatures that are compatible with dry film photoresist materials (i.e., less than 290° C.), and then later re-alloyed in situ at the chip mount reflow temperature to yield a solder joint having a higher solidus temperature. In effect, the second solder paste constituent remains dormant within the solder paste composition until the composition is sufficiently heated to liquefy its alloy powder. The resulting solder joint advantageously exhibits desirable mechanical strength at temperatures of 200° C. and higher, and resistance to thermal cycle fatigue, thereby enabling its associated flip chip to be reliably mounted on circuit boards subject to severe thermal environments.

While our invention has been described in terms of a preferred embodiment, other forms could be adopted by one skilled in the art—for example, by employing alternate processing and deposition techniques, or by employing solder alloy compositions other than those specifically tested. Accordingly, the scope of our invention is to be limited only by the following claims.

The embodiments of the invention in which an exclusive property or privilege is claimed are defined as follows:

1. A solder paste composition comprising multiple solder paste constituents, a first solder paste constituent of the multiple solder paste constituents having lower liquidus and solidus temperatures than a second solder paste constituent of the multiple solder paste constituents, wherein the first solder paste constituent establishes a bumping reflow temperature at which the solder paste composition flows without liquefying all of the multiple solder paste constituents, and wherein a chip mount reflow temperature is established that is higher than the bumping reflow temperature and at which all of the multiple solder paste constituents liquefy in a manner that yields a solder having a homogenous alloy composition, the first and second solder paste constituents comprising indium-lead alloy powders.

2. A solder paste composition as recited in claim 1 wherein the lead content of the second solder paste constituent is higher than the lead content of the first solder paste constituent such that the second solder paste constituent has higher liquidus and solidus temperatures than the first solder paste constituent.

3. A solder paste composition as recited in claim 2 wherein the lead content of the first solder paste constituent is at most about sixty weight percent.

4. A solder paste composition as recited in claim 2 wherein the lead content of the second solder paste constituent is at least about ninety weight percent.

5. A solder paste composition as recited in claim 1 wherein the first solder paste constituent comprises about 40 to about 50 weight percent indium and about 50 to about 60 weight percent lead, the second solder paste constituent comprises up to about 2.5 weight percent silver, about 2.5 to about 5 weight percent indium and about 92.5 to about 97.5 weight percent lead, and the first and second solder paste compositions are combined at a ratio of about 40:60 to about 50:50.

6. A solder paste composition as recited in claim 1 wherein the bumping reflow temperature is less than about 290° C. and the chip mounting reflow temperature is greater than about 300° C.

7. A spherical solder bump comprising:
   a first solder constituent comprising a first metal alloy; and
   a second solder constituent comprising a second metal alloy dispersed in the first solder constituent, the second solder constituent having higher liquidus and solidus temperatures than the first solder constituent, the second metal alloy being an indium-lead alloy containing up to about 2.5 weight percent silver and about 2.5 to about 5 weight percent indium;
   wherein the first solder constituent establishes a bumping reflow temperature for the solder bump at which the solder bump is formed without liquefying the second solder constituent, and the second solder constituent establishes a chip mount reflow temperature that is sufficient to cause both the first and second solder constituents to liquefy and form a solder having a liquidus temperature that is between that of the first and second solder constituents.

8. A solder bump as recited in claim 7 wherein the first solder constituent has a lead content of about fifty to about sixty weight percent.

9. A solder bump as recited in claim 7 wherein the second solder constituent has a lead content of about 92.5 to about 97.5 weight percent.

10. A solder bump as recited in claim 7 wherein the first and second solder constituents are present at a ratio of about 40:60 to about 50:50.

11. A solder bump as recited in claim 7 wherein the first metal alloy of the first solder constituent is an indium-lead alloy containing about forty to about fifty weight percent indium.

12. A method for forming solder bumps for a flip chip circuit device, the method comprising the steps of:
   separately forming first and second solder paste constituents such that the second solder paste constituent has higher liquidus and solidus temperatures than the first solder paste constituent, the first and second solder paste constituents comprising indium-lead alloy powders;
   combining the first and second solder paste constituents to form a solder paste composition;
   depositing the solder paste composition on a substrate through a photoresist mask;
   heating the solder paste composition to a bumping reflow temperature at which the second solder paste constituent does not liquefy and at which the first solder paste constituent liquefies and causes the solder paste composition to flow and form a solder bump;
   cooling the solder paste composition so as to solidify the solder bump;
   registering the solder bump with a mounting surface; and
   heating the solder bump to a mount reflow temperature that is higher than the bumping reflow temperature, the mount reflow temperature being sufficient to liquefy both the first and second solder paste constituents so as to yield a solder joint having a composition based on the first and second solder paste constituents.

13. A method as recited in claim 12 wherein the first solder paste constituent is characterized by a lead content of at most about sixty weight percent.

14. A method as recited in claim 12 wherein the second solder paste constituent is characterized by a lead content of at least about ninety weight percent.

15. A method as recited in claim 12 wherein the first and second solder paste constituents are combined at a ratio of about 40:60 to about 50:50.

16. A method as recited in claim 12 wherein the second solder paste constituent further comprises silver.

17. A method as recited in claim 12 wherein:
   the first solder paste constituent comprises an alloy powder containing about forty to about fifty weight percent indium and about fifty to about sixty weight percent lead; and
   the second solder paste constituent comprises an alloy powder containing up to about 2.5 weight percent silver, about 2.5 to about 5 weight percent indium, and about 92.5 to about 97.5 weight percent lead.

* * * * *